United States Patent
Smith et al.

(10) Patent No.: US 6,246,237 B1
(45) Date of Patent: Jun. 12, 2001

(54) METHOD OF AND APPARATUS FOR TESTING A SAMPLE

(75) Inventors: John Alec Sidney Smith, London; Martin Blanz, Culham; Neil Francis Peirson, Northampton, all of (GB)

(73) Assignee: BTG International Ltd., London (GB)

( * ) Notice: Subject to any disclaimer, the term of this patent is extended or adjusted under 35 U.S.C. 154(b) by 1100 days.

(21) Appl. No.: 08/769,926

(22) Filed: Jan. 15, 1997

Related U.S. Application Data

(63) Continuation of application No. 08/319,445, filed on Sep. 27, 1994, now abandoned.

(30) Foreign Application Priority Data

Sep. 27, 1993 (GB) .................................................. 9319921

(51) Int. Cl.[7] ...................................................... G01V 3/00
(52) U.S. Cl. .......................... 324/307; 324/307; 324/309
(58) Field of Search .................................... 324/300, 301, 324/307, 309, 316, 317, 318, 322; 376/245, 249, 259, 345

(56) References Cited

U.S. PATENT DOCUMENTS

| 3,781,650 | 12/1973 | Keller | 324/311 |
| 3,792,346 | 2/1974 | Gibby et al. | 324/322 |

(List continued on next page.)

FOREIGN PATENT DOCUMENTS

| 114 405 | 8/1984 | (EP) . |
| 0180121 | 5/1986 | (EP) . |
| 0254983 | 2/1988 | (EP) . |
| 254 983 | 2/1988 | (EP) . |
| 256 370 | 2/1988 | (EP) . |
| 0384061 | 8/1990 | (EP) . |
| 2 113 850 | 8/1983 | (GB) . |
| 2 179 747 | 3/1987 | (GB) . |
| 2 242 275 | 9/1991 | (GB) . |
| 2 245 364 | 1/1992 | (GB) . |
| 2 254 923 | 10/1992 | (GB) . |
| 2 262 610 | 6/1993 | (GB) . |
| 9307679 | 4/1993 | (WO) . |

OTHER PUBLICATIONS

Gerothanassis I P: "Methods of Avoiding the Effects of Acoustic Ringing in Pulsed Fourier Transform Nuclear Magnetic Resonance Spectroscopy," Progress in Nuclear Magnetic Resonance Spectroscopy, vol. 19, No. Part 03, Jan. 1, 1987, pp. 267–329, XP000607872 ISSN: 0079–6565.

Fukushima & Roeder, Experimental Pulse NMR, Addison–Wesley Publishing Co., Inc. pp. 466ff, 1981.

Cady, E.B. Clinical Magnetic Resonance Spectroscopy, Plenum Press, 1990, pp. 160ff.

Fukushima & Roeder, Spurious Ringing in Pulse NMR, J. Magn. Reson., vol. 33, 1979, pp. 199ff.

*Primary Examiner*—Christine Oda
*Assistant Examiner*—Brij B. Shrivastav
(74) *Attorney, Agent, or Firm*—Pillsbury Winthrop LLP

(57) ABSTRACT

A method of detecting the presence of a particular substance in a given sample. According to the method, nuclear resonance is excited in a substance and response signals are detected from the substance using a probe. The probe is adjusted in dependence on the character of the sample. A method of detecting the presence of a sample which gives rise to interfering signals, not due to nuclear resonance, comprises exciting nuclear resonance in the sample, and detecting and processing the response signal from the sample in such a way as to at least partially filter out the interfering signals arising from the sample.

44 Claims, 10 Drawing Sheets

U.S. PATENT DOCUMENTS

| | | |
|---|---|---|
| 3,808,518 | 4/1974 | Ignatov et al. ............... 324/300 |
| 3,824,451 | 7/1974 | Freeman et al. ............... 324/312 |
| 3,886,439 | 5/1975 | Lavkien ............... 324/314 |
| 4,081,742 | 3/1978 | Hofer et al. . |
| 4,166,972 | 9/1979 | King et al. ............... 324/310 |
| 4,438,400 | 3/1984 | Patt ............... 324/307 |
| 4,587,493 | 5/1986 | Sepponen ............... 324/319 |
| 4,602,213 | 7/1986 | Sugiura ............... 324/307 |
| 4,678,995 | 7/1987 | Avison et al. ............... 324/307 |
| 4,717,881 | 1/1988 | Flugan ............... 324/307 |
| 4,843,323 | 6/1989 | Encellaz et al. ............... 324/313 |
| 4,887,034 | 12/1989 | Smith ............... 324/307 |
| 5,049,821 | 9/1991 | Deunsing et al. ............... 324/322 |
| 5,168,224 | 12/1992 | Maruizumi et al. ............... 324/300 |
| 5,175,499 | 12/1992 | Davies ............... 324/300 |
| 5,208,537 | 5/1993 | Rietsch et al. ............... 324/322 |
| 5,221,899 | 6/1993 | Gonen et al. ............... 324/307 |
| 5,254,950 | 10/1993 | Fan et al. ............... 324/322 |
| 5,365,171 | 11/1994 | Buess et al. ............... 324/307 |
| 5,397,987 | 3/1995 | Garritano ............... 324/307 |
| 5,457,385 | 10/1995 | Smith ............... 324/301 |

METHOD OF AND APPARATUS FOR TESTING A SAMPLE

This is a Continuation of National Appln. No. 08/319,445 filed Sep. 27, 1994 now abandoned.

FIELD OF THE INVENTION

The present invention relates to a method of testing a sample, and to apparatus for testing the sample. It relates especially to Nuclear Quadrupole Resonance (NQR) testing a sample containing or suspected of containing nuclei of integral or half-integral spin quantum number (I>½).

BACKGROUND OF THE INVENTION

NQR testing is used for detecting the presence or disposition of specific substances. It depends on the energy levels of quadrupolar nuclei, which have a spin quantum number I greater than ½, of which $^{14}N$ is an example (I=1). $^{14}N$ nuclei are present in a wide range of substances, including animal tissue, bone, food stuffs, explosives and drugs. One particular use of the technique of the present invention is in the detection of the presence of substances such as explosives or drugs. The detection may be of baggage at airports, or of explosives or drugs concealed on the person or buried underground.

In the molecular environment of compounds in crystals, the nature and disposition of the electrons and other atomic nuclei close to the nucleus of interest produce an electric field gradient at the latter which interacts with its electric quadrupole moment to generate a set of energy levels, the transition frequencies between which are characteristic for a given substance. The presence of this frequency or frequencies not only indicates which nuclei are present, but also their chemical environment, thus indicating specific substances or types of substances in any tested sample.

In conventional NQR testing a sample is placed within or near to a radio-frequency (r.f.) coil and is irradiated with pulses or sequences of pulses of electro-magnetic radiation having a frequency which is at or very close to a resonance frequency of the quadrupolar nuclei in a substance which is to be detected. If the substance is present, the irradiant energy will generate a precessing magnetization which can induce voltage signals in a coil surrounding the sample at the resonance frequency or frequencies and which can hence be detected as a free induction decay (f.i.d.) during a decay period after each pulse or as an echo after two or more pulses. These signals decay at a rate which depends on the time constants $T_2^*$ for the f.i.d., $T_2$ and $T_{2e}$ for the echo amplitude as a function of pulse separation, and $T_1$ for the recovery of the original signal after the conclusion of the pulse or pulse sequence.

In conventional NQR testing, either a substantial part of the f.i.d. is measured after each pulse or the responses are measured as echoes in the relatively short sampling periods between or following a succession of two or more pulses. Usually the results from a number of test pulses or test sequences are accumulated to improve the signal-to-noise ratio. Various schemes of pulse sequences have been used.

The present invention arises, in one aspect, from the surprising discovery that, in the detection of the presence of a particular substance in a given sample using nuclear resonance techniques, interfering signals may arise from the sample which may swamp the genuine nuclear resonance signals. This is particularly so in circumstances where the amount of the particular substance is much less than the amount of the remainder of the sample, and the interfering signals arise from the remainder of the sample. Such circumstances, it has now been discovered, occur commonly. For example, small amounts (maybe only a few tens of grams) of narcotics are frequently concealed within bulky pieces of airport baggage. Many common household items carried in baggage, it has been found, are likely to give rise to interfering signals.

The problem of one kind of interference when testing a particular substance is known from a book entitled "Experimental pulse NMR", by Fukushima, E. et al, Addison-Wesley Publishing Company, Inc., pp. 466ff. The interference takes the form of spurious ringing caused by piezo-electric resonance of the substance. However this problem is not disclosed in the context of detecting the presence of the substance within a given sample.

It is known from this book to solve this particular interference problem by using an electrostatic shield (Faraday shield) between the sample and the NMR probe (usually a coil) to reduce the interference. However, such a shield can be bulky and unwieldy. Furthermore, it has been discovered pursuant to the present invention that, particularly with NQR testing, there may be different types of interference other than that caused by piezo-electric resonance, and that the Faraday shield may not successfully reduce all these types of interference.

Also, it is known from a book by Cady, E. B. entitled "Clinical Magnetic Resonance Spectroscopy", Plenum Press (1990) (see pages 160ff.) in the field of Nuclear Magnetic Resonance Imaging to adjust the NMR probe according to the nature (for instance, size) of the body being imaged. This adjustment is not to take account of interfering signals from the body; rather, the body is actually the "substance" under test, and the adjustment is to ensure appropriate "matching" of the probe and the body. A similar technique is known from European Patent No. 0 180 121.

Such adjustment has not hitherto been contemplated for nuclear resonance techniques involving the detection of the presence of a particular substance in a given sample, partly, perhaps, because the amount of the substance under test is generally so small in relation to the total amount of the sample and the volume probed by the probe (that is, the filling factor is so small), that the possibility of requiring matching between the probe and the substance/sample has ever been contemplated. Typically, the filling factor might be only fraction of one percent.

According to a first aspect of the present invention, there is provided a method of detecting the presence of a particular substance in a given sample comprising exciting nuclear resonance in the substance and detecting the response signals from the substance, using a probe, and adjusting the probe in dependence on the character of the sample.

It has been found pursuant to the present invention that adjustment of the probe in dependence on the character of the sample can have the advantage of reducing interference from many types of substances (other than the substance of interest) commonly found in a typical sample such as airport baggage. Hence the invention can provide more accurate and sensitive tests than if such adjustment does not take place, and can also reduce the false alarm rate.

In the present invention, there is no need to adjust the probe in dependence on the character of the particular substance at all. The filling factor of the substance would be assumed to be so small (a fraction of one percent, say, corresponding to a few tens or hundreds of grams of explosive in a suitcase) that adjustment of the probe in dependence on the character of the substance is simply not necessary.

Preferably, the probe is adjusted (or adjustable) whilst it is in operation. This feature is particularly advantageous if baggage is being checked for the presence of explosives or drugs, for instance on a conveyor at an airport. The nature of the interference from each individual item of baggage may be different, and hence the sensitivity of the tests can be improved by adjusting the probe individually for each item of baggage.

The principles underlying this aspect of the invention are as follows. In the case of NQR testing, it has been determined pursuant to the present invention that there are two groups of materials which produce interference problems that may require adjustment of the r.f. probe usually used in NQR testing.

The first group includes metallic conductors which conduct electronically, such as brass, copper and aluminium. Such materials may be commonly found in many types of objects in baggage, for instance, in electronic circuitry. For this group, the interference effects are caused largely by eddy currents induced by the NQR r.f. excitation. These effects may be particularly acute in the case of metallic loops such as leads or connections on printed circuit boards or on metal sheets. They cause electrical loading and thereby alter the inductance of the sample coil forming part of the r.f. probe, and hence change the resonance frequency of the probe (since the probe may be considered to include a resonant circuit of which the inductance of the coil forms one part). If the quality factor (Q) of the coil lies within the usual range (20 to 60, for example), so that the probe has a relatively narrow bandwidth, then the resonance frequency of the probe may be shifted so far that the sensitivity for NQR detection is significantly reduced. Further, a change in the inductance of the sample coil may also adversely affect the matching between the probe and the r.f. transmitter. Also, the Q factor itself may be adversely affected by a change in the inductance of the sample coil, so that the sensitivity of detection is adversely affected. It will be understood that Q=ωL/R (where ω is the (angular) resonance frequency of the probe, L is the inductance of the coil, and R is the series resistance of the probe) and that signal-to-noise ratio (and hence sensitivity of detection) varies as the square root of Q.

Included in the first group as a special case are magnets and magnetic materials. Such magnets, if made of electronic conductors, as would usually be the case, would cause interference effects similar to those described in the preceding paragraph. However, they can also cause a shift in and possibly even a splitting of the particular resonance line of interest. Although the probe may require re-tuning to take account of these additional effects, it is not believed that this would normally be necessary.

The second group of materials includes non-metallic materials which conduct ionically, such as wet sand or soil and the electrolyte in batteries. Like the first group of materials, this second group also has the effect of altering the resonance frequency and Q factor of the probe, but this time through the mechanism of dielectric loss, which causes a change in the resistance of the probe and also causes a change in its inductance.

In putting the first aspect of the present invention into practice, the invention suitably provides that the presence (and character) of such interfering materials is detected and then acted upon by effecting suitable adjustment of the probe.

Detection of such materials is preferably effected by measuring the back-reflected r.f. power from the sample, for example, using a directional coupler. An increase in back-reflected power indicates that the probe is no longer correctly tuned and hence indicates the presence of an interfering material.

Adjustment of the probe may be effected firstly by adjusting the matching of the probe to the r.f. transmitter (that is, by adjusting the impedance of the probe). This may be achieved, for example, by insertion of a ferrite rod into a tapped inductance in the probe circuitry, the rod being moved by a stepper motor programmed to seek the position of minimum back-reflected wave as measured for instance by a directional coupler.

Secondly, the resonance frequency of the probe may be adjusted by automatically tuning the probe via a servo or stepper motor on the axis of a variable capacitor in the tuning circuitry. The capacitance is varied until the r.f. field amplitude ($B_{r.f}$) is a maximum, as monitored by a simple pick-up coil placed near the r.f. coil. The alternating voltage induced in the pick-up coil could be rectified by either a diode or a quadrature detector and the resulting d.c. voltage fed to the control computer by means of an Analog to Digital Converter, where it could be compared with a known reference voltage, the difference between the two being used to control the stepper motor. The same quadrature detector and transient recorder could be used both for the main coil and the pick-up coil, which could render this technique relatively cheap.

Finally, it might be necessary to check that the Q factor of the r.f. coil was unchanged, which could be done automatically in a short time by frequency sweeping the r.f. pulse in small steps, so as to measure the frequency difference $\Delta v=|v_1-v_2|$, where $v_1$ and $v_2$ are the frequencies at which the r.f. current (as measured by a pickup coil) has dropped to 0.71 of its maximum value, and then using the well-known equation $$Q = \frac{v}{\Delta v} = \frac{(v_1 + v_2)}{2|v_1 - v_2|}$$

to derive a value for Q.

If the Q has diminished significantly its value can be restored by removing damping devices such as metal paddles or series resistors deliberately fitted for this purpose. Alternatively, the NQR test instrument, once forewarned, could be programmed to perform the test with more accumulations to overcome the effect of the drop in Q; since signal-to-noise ratio is proportional to $Q^{1/2}$, the number of accumulations must be increased by the factor $Q_{old}/Q_{new}$. Further, the r.f. power needs to be increased if Q is lower in order to maintain the same flip angle.

It will be appreciated that not all of the above three adjustments may be necessary. However, if they are, they should preferably be carried out in the order (i) Tuning, (ii) Matching, (iii) Q factor adjustment, although other orders are possible. Further, the various adjustments may interact with one another, so that an interactive set of adjustments may need to be carried out. The three adjustments proposed above may take, say, between 0.1 and 1 second, perhaps 0.2 to 0.5 seconds.

In certain circumstances, for example, a sheet of RDX next to a metal sheet (or sandwiched between two metal sheets) of sufficient thickness, the r.f. field may be very significantly compensated by eddy currents, thereby considerably reducing sensitivity. In these and other circumstances the NQR testing apparatus may be arranged to provide an alarm signal of insensitivity or of the presence of metal. Appropriate remedial action (such as increasing the r.f.

power and/or number of accumulations, or hand-inspection of the particular object under suspicion) can then be taken.

According to a second aspect of the present invention, there is provided a method of nuclear resonance testing a sample, comprising exciting nuclear resonance in the sample, and detecting and processing the response signal from the sample in such a way as to at least partially filter out interfering signals, not due to nuclear resonance, arising from the sample.

It will be understood that, in the context of the detection of the presence of a particular substance in a sample, it would usually not be the substance to be detected but the remainder of the sample which would give rise to the interfering signals.

By filtering interfering signals via the detecting and processing means rather than by means of a Faraday cage physically surrounding the sample, the present invention can be considerably simpler to put into practice, especially in the case of baggage being tested on a conveyor belt.

It is possible to, and in certain cases of strong electric interference, it may be necessary to, use both a Faraday cage and signal detection and processing techniques.

The invention is preferably performed in the absence of an applied magnetic field.

A further discovery pursuant to the present invention is that there are materials such as ferromagnetic materials, certain steels or nickel-plated objects (for instance, screws or key-rings) which produce a strong spurious signal immediately following the r.f. pulse which is frequency and phase coherent with the pulse and which cannot therefore be reduced by repeated accumulations (unlike most other interference, which can be). The precise cause of this type of interference has not been proven, but it is believed to emanate from ferromagnetic or like resonance effects in the $B_1$ field of the sample coil. It should be emphasised that this interference is not an artefact of the particular detection apparatus used, but a feature of the material itself.

Piezo-electric materials may also produce frequency and phase coherent mechanical resonances which may lie in the frequency range of the NQR response. For instance, sand can produce interference at an r.f. frequency of 5 MHz.

It may be necessary to compensate for this interference by adjusting the probe, as discussed above, unless the interference emanates from piezo-electric materials, which are non-conductors. Further, since the effects of the interference cannot be reduced by repeated accumulations, there is a requirement to provide suitable techniques for reducing these effects. The present invention provides these techniques in two further aspects.

In a first such aspect, there is provided a method of nuclear resonance testing a sample, especially one which gives rise to interfering signals, not due to nuclear resonance, comprising exciting nuclear resonance in the sample, and detecting the response signal from the sample, there being a delay of a predetermined duration between the end of the excitation and the beginning of the detection.

This aspect arises from the discovery pursuant to the present invention that the spurious signals constituting the interference decay rapidly after the r.f. pulse, usually within, say, 350, 500, 750 or 1000 $\mu$s of the end of the r.f. pulses. Thus, provided the decay time of these signals is significantly less than the f.i.d. time ($T_2^*$) or echo decay times ($T_2$, $T_{2e}$) of the NQR response, useful response data can be derived by delaying detection of the response signal for a predetermined duration, until all or the bulk of the spurious signal has decayed. A delay of 500, 600 or 700 $\mu$s has been found empirically to be satisfactory in most circumstances.

A sufficient decay for the response signal might be to below 20, 10 or 5% of its initial peak value.

On the basis of a delay of 500, 600 or 700 $\mu$s, this aspect of the invention would be particularly suited to materials exhibiting a $T_2^*$, $T_2$ or $T_{2e}$ greater than, say, 1 ms, so that the spurious signal has ample time to decay before there is a serious loss in the NQR response signal. One such material is the explosive RDX, which has one frequency with a $T_2^*$ of 1.4 ms at room temperature.

Thus it will be understood that in practice there are both upper and lower bounds on the duration of the delay. The lower bound is dictated by the requirement that the spurious interfering signals have sufficient time to decay to negligible or near-negligible levels. The upper bound is dictated by the requirement that the NQR response signal has not decayed so much that no useful response data can be detected.

In one preferred embodiment, the excitation is such as to cause a free induction decay response signal, and the delay occurs during this response signal. In another preferred embodiment, the excitation is such as to cause an echo response signal, and the delay occurs between the end of the excitation (normally the refocussing pulse) and the echo response signal.

In a second such aspect of the present invention, there is provided a method of nuclear resonance testing a sample, comprising exciting nuclear resonance in the sample using at least two different types of excitation, such that the nuclear resonance can be distinguished from interfering signals, not due to nuclear resonance, arising from the sample, from a comparison between the response signals from the different types of excitation; detecting the response signals from the sample; and comparing the detected response signals from the different types of excitation.

This aspect arises from the discovery pursuant to the present invention of certain ways in which the spurious interfering signals can be distinguished from the genuine nuclear resonance.

In one preferred embodiment, this distinction can be made by arranging that the different types of excitation are such as to produce, for the respective response signal from each different type of excitation, a nuclear response signal and an interfering signal of a different relative phase. For example, if the relative phase is 180° (anti-phase), the different types of excitation may be such as to produce nuclear response signals of different relative phase.

In another preferred embodiment, this distinction can be made by arranging that the different types of excitation are such as to produce, for the respective response signal from each different type of excitation, a nuclear response signal and an interfering signal of a different relative amplitude. Preferably, the amplitude of the nuclear response signal differs according to the type of excitation, whilst the amplitude of the interfering signal remains the same. For example, the different types of excitation may be such as to saturate the nuclear response to different extents.

The invention in its various aspects extends to apparatus equivalent to the above methods. Apparatus features analogous to the various method features can be provided within the scope of this invention. Further, the various aspects and features of the invention may be combined in any appropriate way.

For example, there is provided according to the present invention apparatus for nuclear resonance testing a sample, comprising means for exciting nuclear resonance in the sample using at least two different types of excitation, means for detecting the response signals from the sample, and means for comparing the detected response signals from the different types of excitation.

BRIEF DESCRIPTION OF THE DRAWINGS

Preferred features of the invention are now described, by way of example only, with reference to the accompanying drawings, in which.

DESCRIPTION OF PRESENTLY PREFERRED EXEMPLARY EMBODIMENTS

Figure 1:
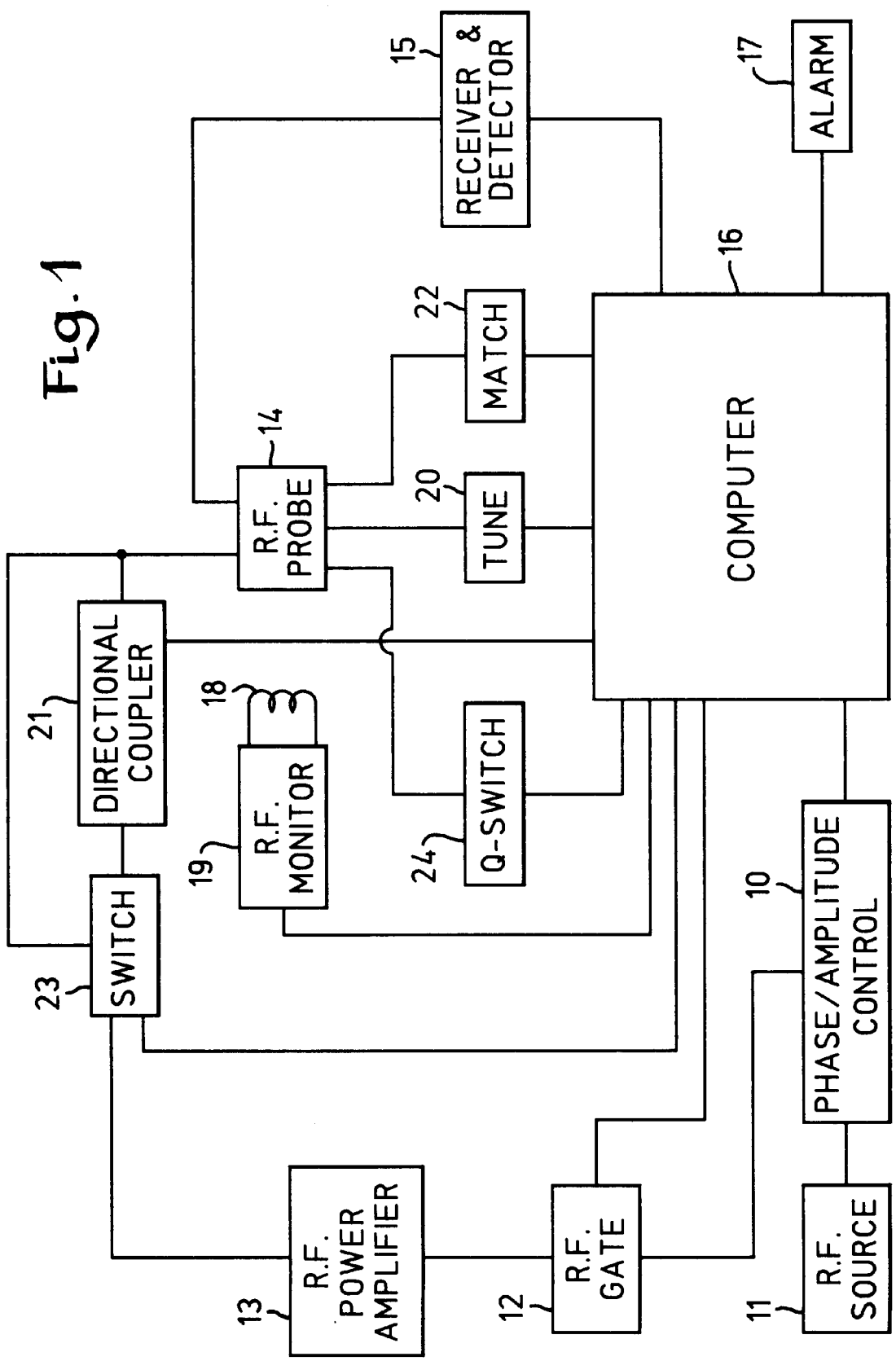
FIG. 1 is a block diagram of apparatus for NQR testing according to the present invention.

Referring first to FIG. 1, apparatus for NQR testing includes a radio-frequency source 11 connected via a phase/amplitude control 10 and a gate 12 to an r.f. power amplifier 13. The output of the latter is connected to an r.f. probe 14 which contains one or more r.f. coils disposed about the sample to be tested (not shown), such that the sample can be irradiated with r.f. pulses at the appropriate frequency or frequencies to excite nuclear quadrupole resonance in the substance under test (for example, an explosive). The r.f. probe 14 is also connected to r.f. receiver and detection circuitry 15 for detecting nuclear quadrupole response signals. The detected signal is sent from circuitry 15 to a computer 16 for processing, for signal addition or subtraction, and thence to an audio or visual alarm 17 which alerts the operator to the presence of the substance under test.

The computer 16 also controls all pulses, their radio frequency, time, width, amplitude and phase; it also checks the tuning of the r.f. probe 14 by means of a pick-up coil 18 and r.f. monitor 19, making adjustments by means of the tuning control 20. The matching to the r.f. power amplifier 13 is monitored by means of a directional coupler 21 (or directional wattmeter), which the computer responds to via a matching circuit 22, which in turn adjusts the r.f. probe 14 by means of a variable capacitance or inductance. The directional coupler 21 is switched out by the computer 16 when not required, via switch 23. The Q factor of the r.f. coil is monitored by a frequency-switch program and adjusted by means of a Q-switch 24 which either changes the coil Q or alternatively alerts the computer to increase the number of measurements.

The computer 16 may be programmed in various ways to reduce or eliminate the spurious interference described above and caused by materials such as ferromagnetic materials, certain steels and nickel-plated objects.

Not shown in FIG. 1 is some means, such as a conveyor belt, for transporting a succession of samples to a region adjacent the r.f. probe 14. The computer 16 is arranged to time the application of the excitation pulses substantially simultaneously with the arrival of a particular sample adjacent the probe.

In a first embodiment of the invention, spurious response signals can be reduced or eliminated by programming the computer to delay the acquisition of data for sufficient time after the end of an r.f. pulse to allow the spurious response signals to decay to insignificance.

In a first variant of this first embodiment, this is achieved by capturing response signals during the f.i.d. excited by an r.f. pulse, after a delay of a predetermined duration following that pulse. This technique is possible when such signals have a decay time which is significantly less than the f.i.d. time of the NQR response.

Figure 2:
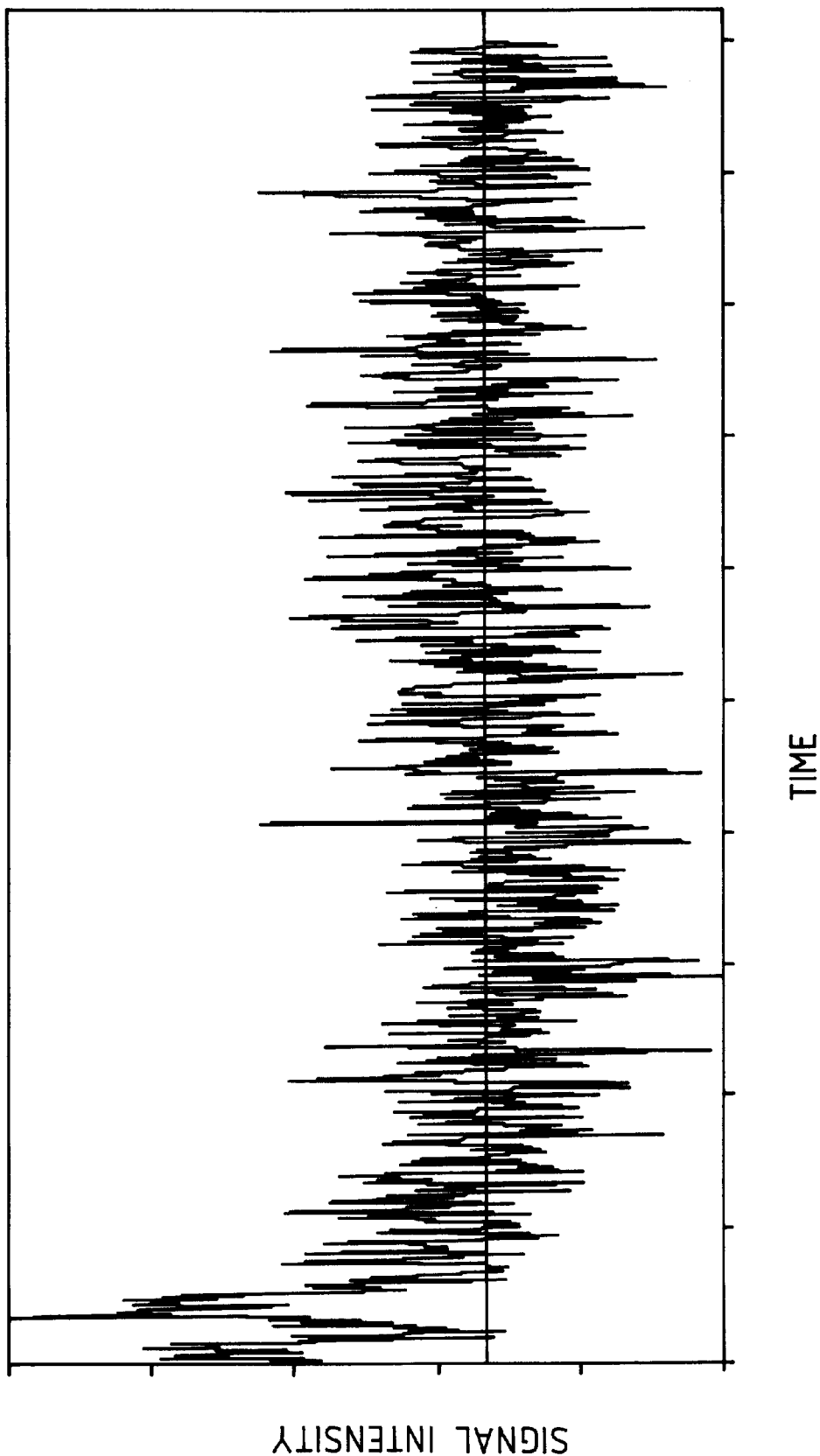
FIG. 2 is a time-domain plot of a free induction decay (f.i.d.) obtained from a sample comprising the explosive RDX and nickel-plated steel washers.
Figure 3:
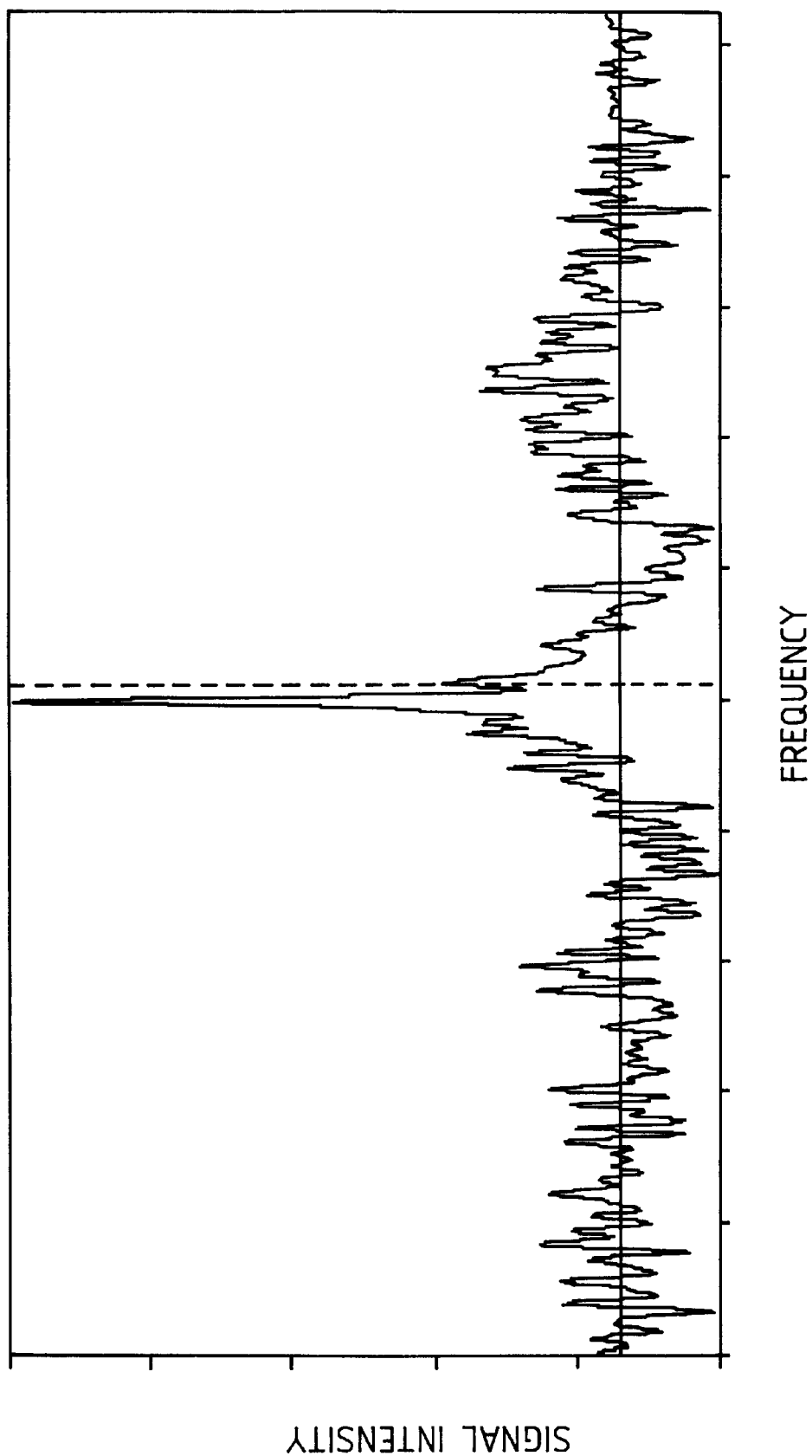
FIG. 3 is a frequency-domain plot corresponding to the time-domain plot of FIG. 2.
Figure 4:
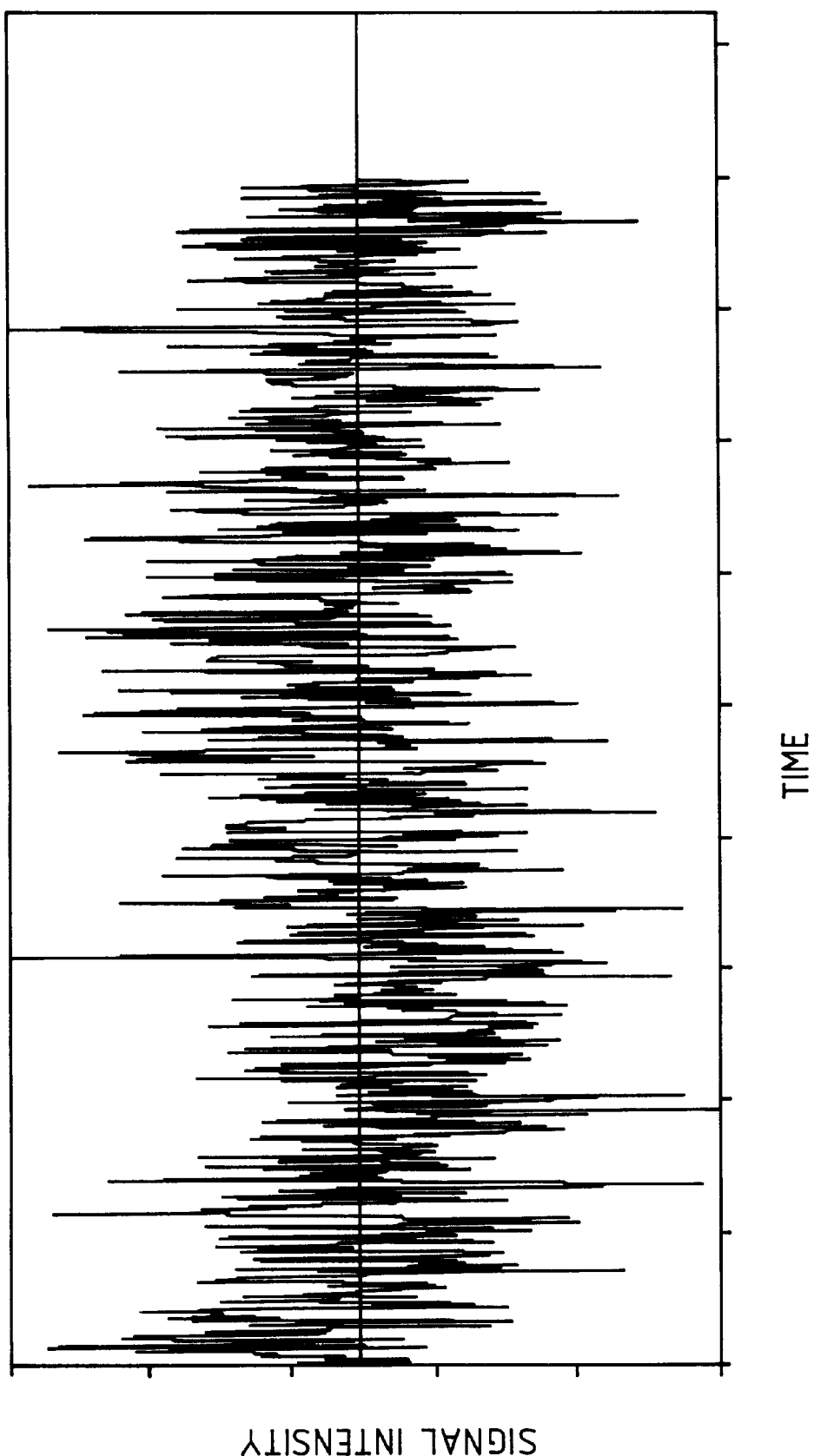
FIG. 4 is a corrected version of the plot of FIG. 2.
Figure 5:
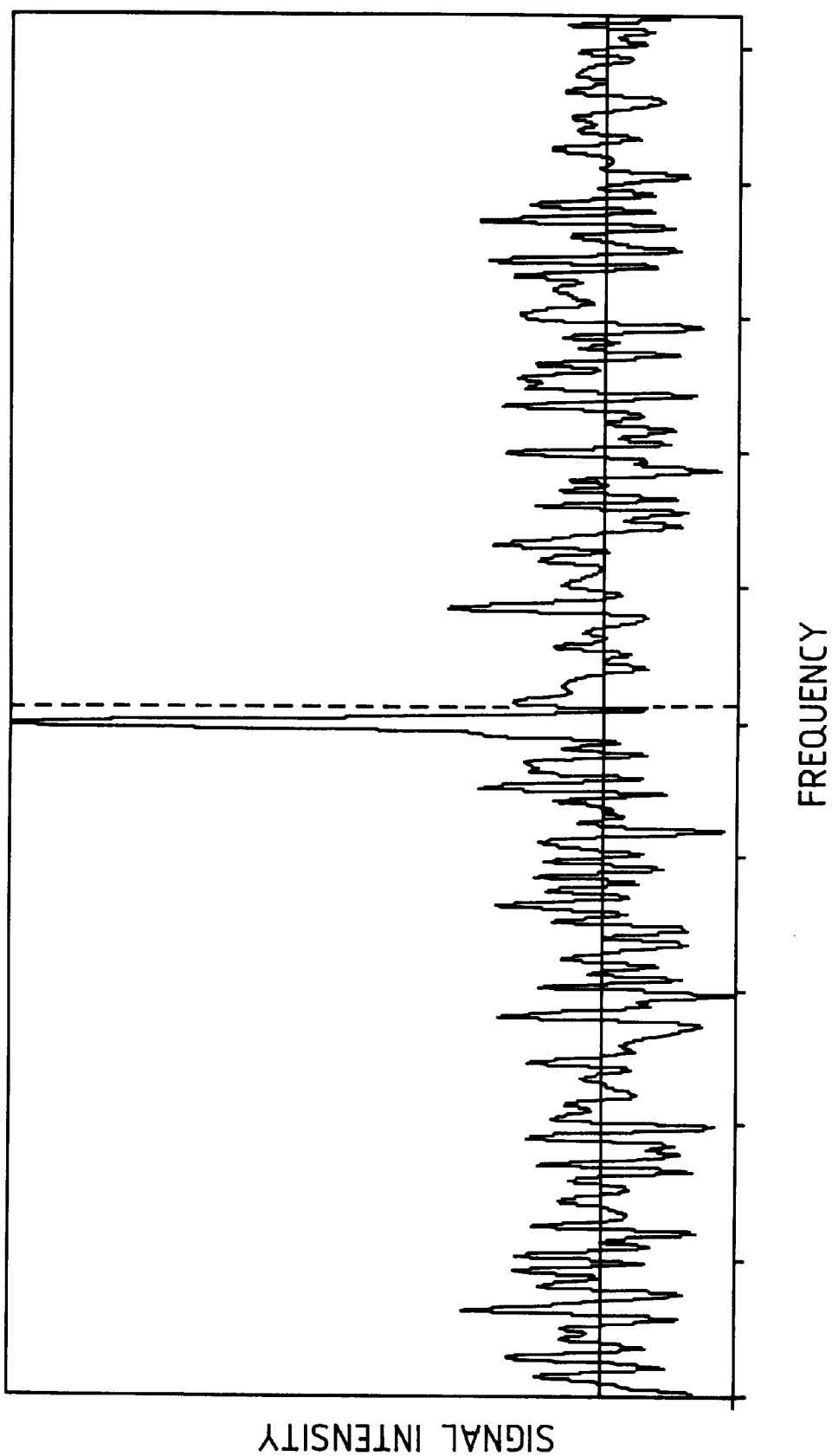
FIG. 5 is a frequency-domain plot corresponding to the time-domain plot of FIG. 4.

As an example, in FIG. 2 the f.i.d. of a sample consisting of 15 g of the explosive RDX and 75 g of nickel-plated steel washers at an excitation radio frequency of 5192 kHz and a temperature of 296K is shown. FIG. 3 shows the corresponding absorption spectrum (that is, the phase-corrected real part of the Fourier transform of the f.i.d.). FIG. 2 shows a strong spurious signal at and near the excitation frequency which decays to undetectability in about 500 $\mu$s (each division on the horizontal axis represents 500 $\mu$s). However, the oscillations from the RDX sample (for which $T_2^*=1.4$ ms) persist for at least 4 ms; FIG. 3 shows a narrow RDX response (the largest peak) superimposed on the broad response of the washers. In FIG. 3, the whole range of the horizontal axis represents 25 kHz. FIG. 4 shows, to the same horizontal scale as that of FIG. 2 but to an enlarged vertical scale, the same f.i.d. but shifted to the left by 500 $\mu$s. FIG. 5 shows the corresponding Fourier transform, which reveals only the narrow RDX response, the spurious response having been eliminated. In the above example, in both the corrected and he uncorrected cases an initial 140 $\mu$s was allowed before signal acquisition for probe ring down.

The technique of the first variant can be applied not only to r.f pulses of the optimum "90°" flip angle, but also to those of a different or lower flip angle, and to those which have been amplitude and phase modulated to improve the performance of the NQR test. Because of the loss of some $^{14}$N signal during the time delay, however, the signal-to-noise ratio for NQR detection is reduced (the noise remains unchanged, the signal is less). After 500 $\mu$s, in the above example the NQR integrated response was reduced by 26%, after 1000 $\mu$s by 46%.

Therefore a reduction in signal strength of about 30% would be expected, and, to restore the NQR test to its original sensitivity, an increase in Q factor or number of accumulations by a factor of two will be needed, or possibly a combination of both.

In other experiments carried out with nickel plated steel washers and nickel-plated brass nuts it was observed that the duration of the spurious interfering signals at a level greater than noise was 750 $\mu$s to 1000 $\mu$s, which indicates that a delay of 500–600 $\mu$s in addition to the ring down time (say, 600 to 700 $\mu$m in total) should be adequate in many circumstances to reduce these spurious signals to acceptable levels. An acceptable level would perhaps be twice, possibly 1.5 or even 1.2 times the average noise level.

In other experiments, no spurious interfering signals were detected with pure iron foil, stainless steel or brass. It is not known for certain what causes such signals in the case of nickel-plated objects.

A second variant of this embodiment is applicable when the echo decay times $T_2$, $T_{2e}$ are long (for instance, much longer than 1 ms) while $T_2^*$ is short. It is applicable to RDX, but is perhaps more useful for substances such as possibly TNT or PETN which have a short $T_2^*$ (for instance, less than 1 ms).

In this second variant, two or more pulses of selected width and phase are used to generate one or more echoes, for example by the sequence "90°" -τ- "180°"-τ-echo. τ is made shorter than $T_2$, but, since $T_2 \gg T_2^*$, no signals from interfering materials will usually be detected during acquisition of the echo.

An advantage of this second variant over the first variant is that it is applicable to PETN and TNT, whilst the first variant may not be applicable. However, it has the disadvantage over this first variant of requiring r.f. pulses of sufficient power to produce $90°_{effective}$ ($119°_{actual}$) and $180°_{effective}$ ($259°_{actual}$) flip angles.

In a second embodiment of the invention, techniques are employed to distinguish between spurious interfering response signals and the genuine NQR response signals.

A first variant of the second embodiment is particularly appropriate when the f.i.d. time $T_2^*$ is comparable with or shorter than the decay time of the spurious signal. This might be the case with RDX when the interfering material is a piezoelectric material (which exhibits a strong response). In this variant, the spurious signal is eliminated by repeating the test after changing the phase of the NQR response by 180° and then subtracting the two signals. The phase change of 180° may be produced, for example, by a preliminary "180°" pulse, inserted before the measuring pulse so that two types of pulse sequences are generated, denoted A and B, which give rise to NQR responses of opposite sign (that is, in anti-phase).

Pulse sequence A comprises a single measuring pulse, which is a rectangular or amplitude and/or phase-modulated pulse (of "90°", or a different flip angle may be used) following which the f.i.d. is collected and stored. Pulse sequence B is the same, except that it is preceded by a rectangular or amplitude and/or phase-modulated "180°" pulse which inverts the NQR signal. The f.i.d. following the pulse B sequence is then subtracted from that following pulse A, thereby substantially eliminating the spurious response whilst summing the NQR signal.

Figure 6:
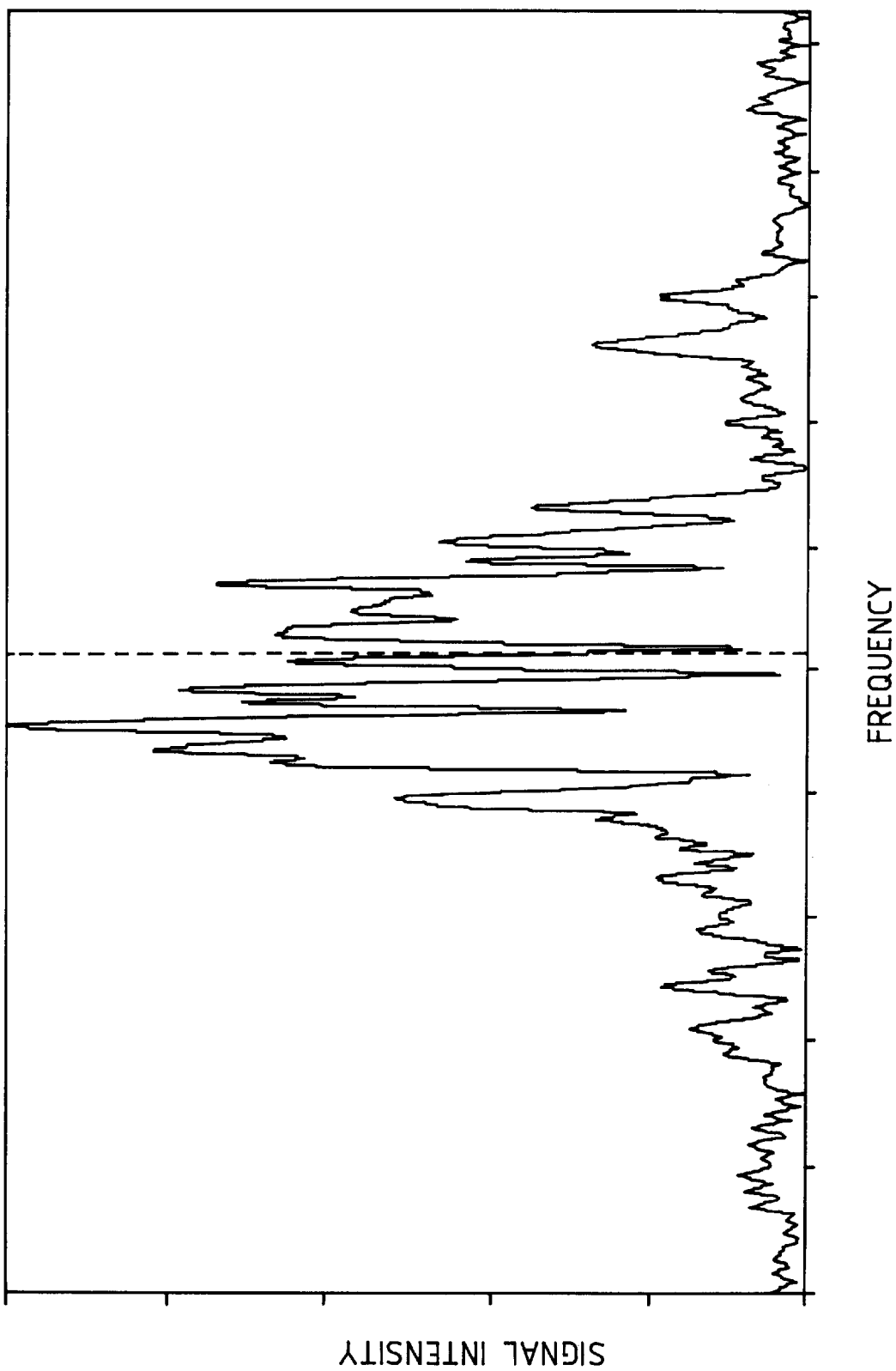
FIG. 6 is a plot similar to that of FIG. 3 but obtained using a different test.
Figure 7:
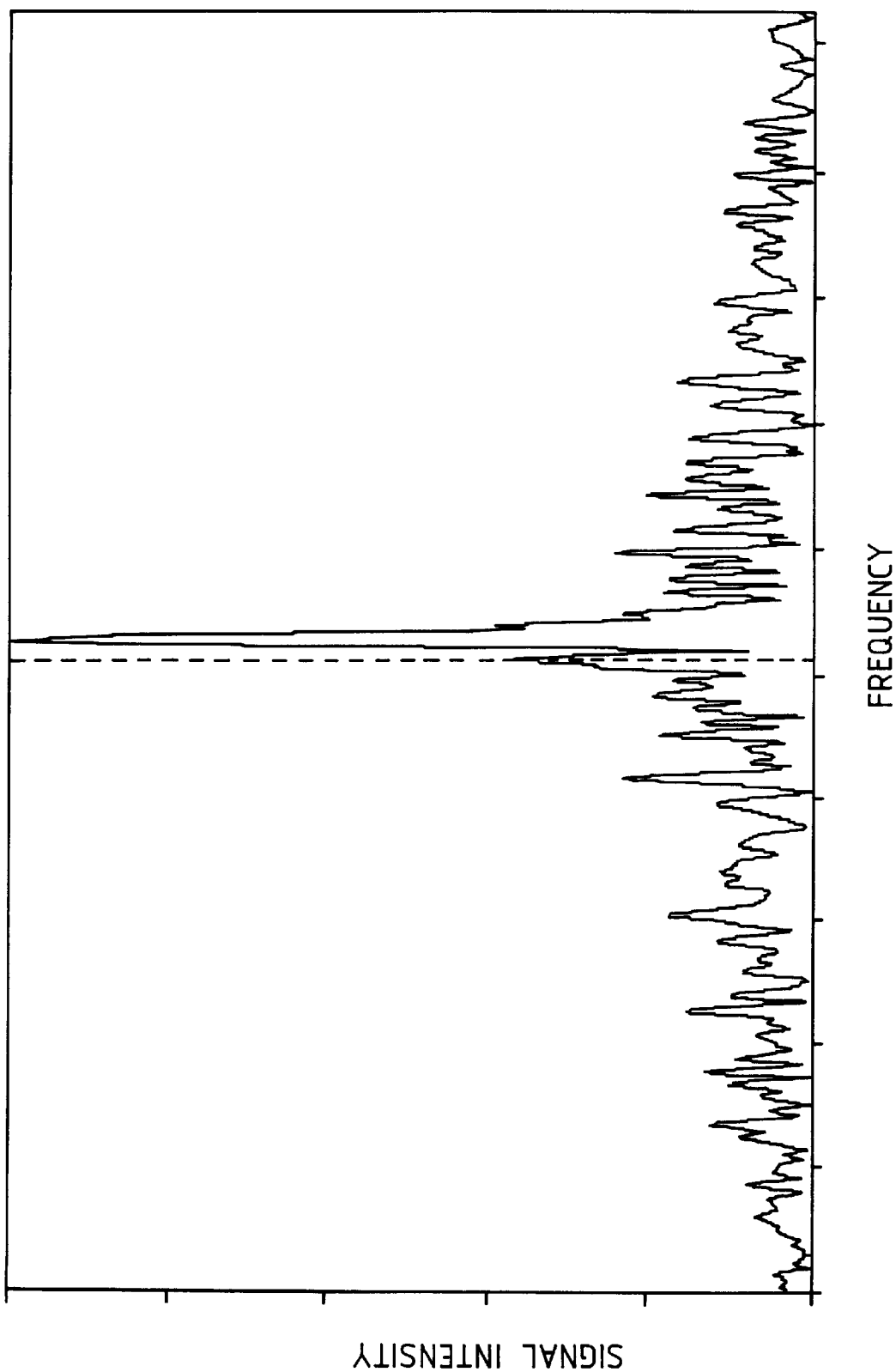
FIG. 7 is a corrected version of the plot of FIG. 6.

FIG. 6 shows the modulus of the Fourier transformed response from a sample consisting of 15 g of RDX and 60 g of nickel-plated steel washers; no NQR signal is visible, but it is immediately restored when the two-pulse sequence is used, as shown in FIG. 7. FIGS. 6 and 7 demonstrate that the spurious interfering signal is not phase-shifted, whereas, of course, the NQR response signal is. The frequency range in these two figures is 125 kHz.

The two pulse sequences A and B can be generated successively, or an equal number of A pulses can be followed by an equal number of B pulse sequences, and the summed responses then subtracted. Allowance may need to be made for any loss in signal and increase in noise by increasing the Q-factor of the r.f. coil or the number of accumulations.

A second variant of the second embodiment is applicable particularly where the f.i.d. time $T_2^*$ is comparable to or shorter than the decay time of the spurious signal, but where the nature of the sample or the NQR test requires pulse widths considerably less than "180°" or even "90°" (so that it is not possible to invert the signal). The NQR apparatus is set to generate low flip-angle r.f. pulses, say "30°", by means of rectangular and amplitude and/or phase-modulated pulse waveforms. Pulse sequence A is then a single pulse of this kind following which the full f.i.d., spurious plus NQR response, is collected. Pulse sequence B is then a saturation train of, say, n such pulses of separation τ given by $T_2^* < \tau \ll T_1$, where $T_1$ is the spin-lattice relaxation time of the NQR response signal; the f.i.d. following the last of those n pulses, consisting of the spurious response only, is then collected and subtracted from the first to give the NQR signal only. It has been found by experiment that n may only need to be 2, 3 or 4.

Figure 8:
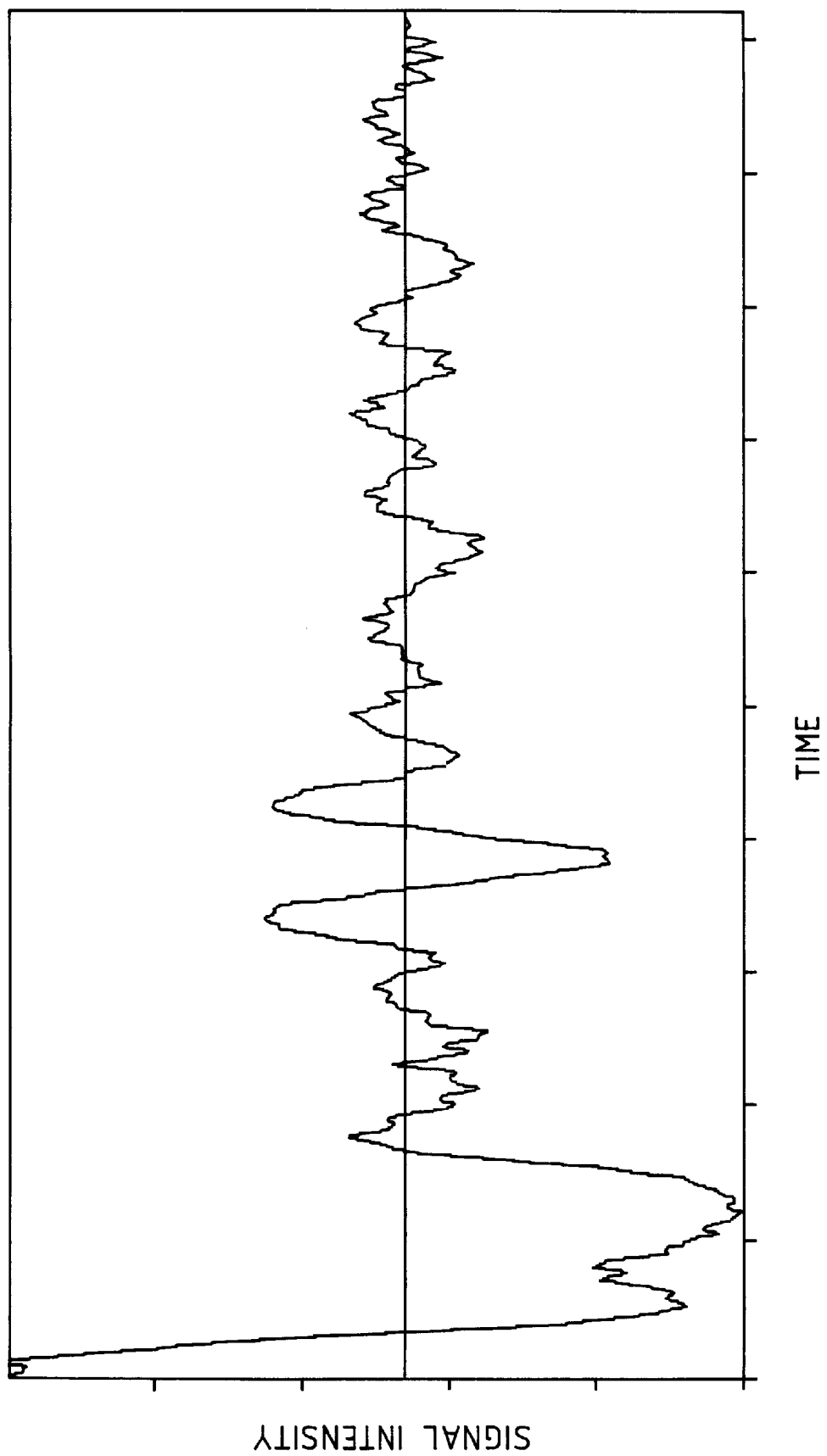
FIG. 8 is a plot similar to that of FIG. 2, but using a further different test.
Figure 9:
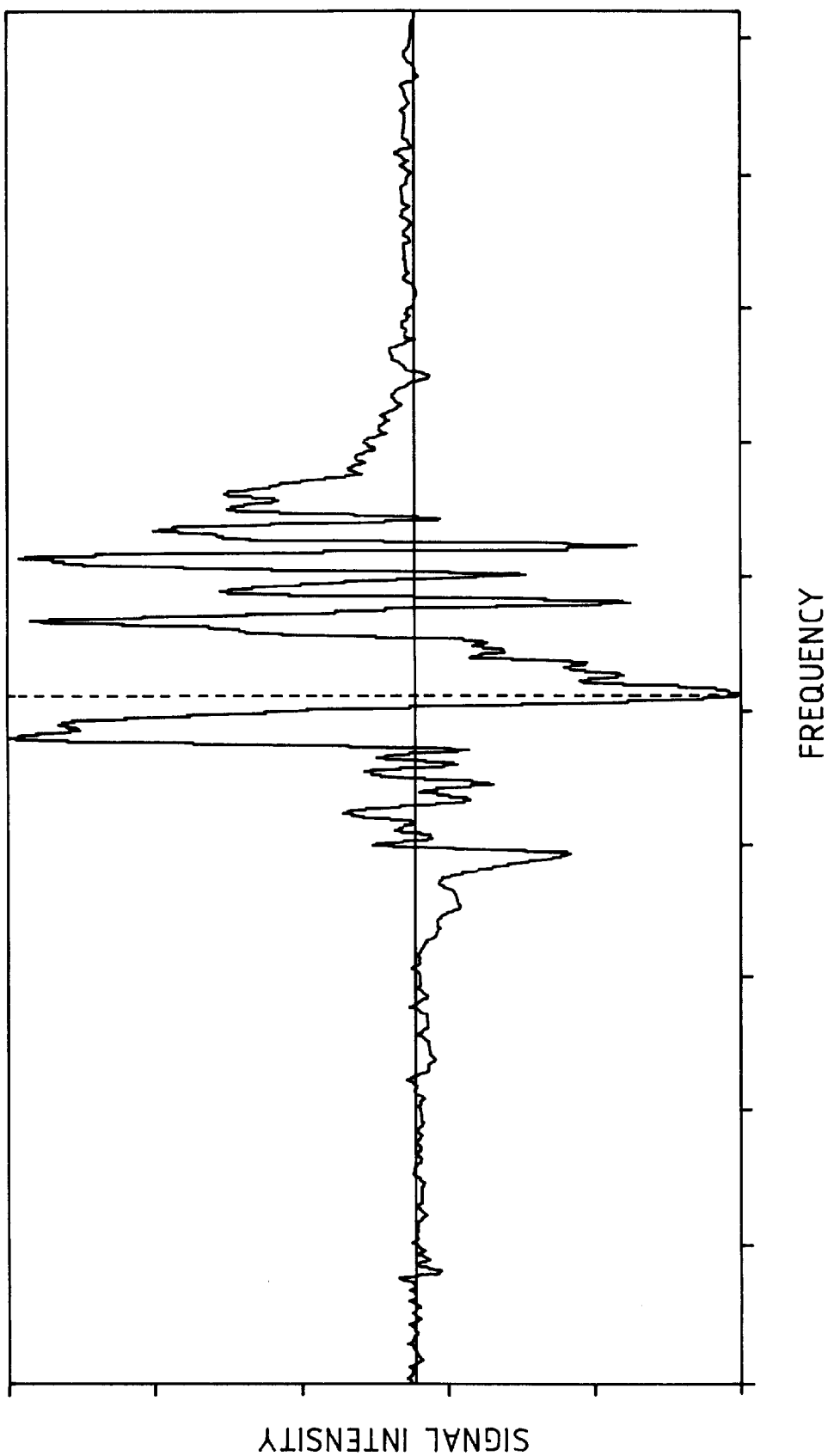
FIG. 9 is a corresponding frequency-domain plot.
Figure 10:
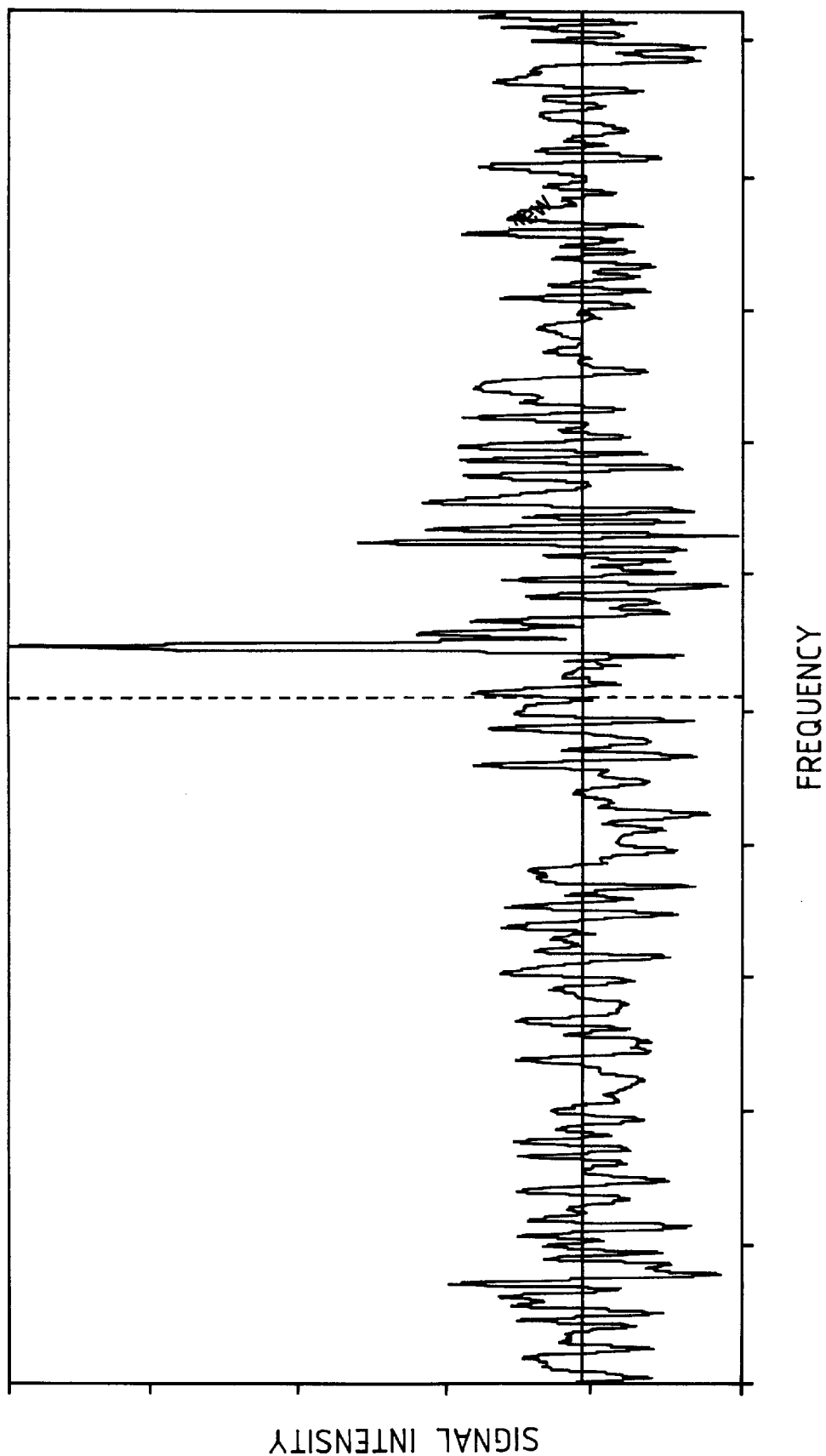
FIG. 10 is a corrected version of the plot of FIG. 9.

As an example, the resultant f.i.d. for the substance RDX at 5190 kHz in the presence of an interfering substance (in this case and) at 297K is shown in FIG. 8. In FIG. 8, each division on the horizontal axis represents 200 μs. The pulse sequence (of the "A" type) comprised a "30°" shaped pulse. The resulting f.i.d. after 400 accumulations is shown. Its Fourier transform is shown in FIG. 9, in which the total frequency range is 62.5 kHz. Pulse sequence B is a sequence of n=3 such pulses separated by 4 ms ($\tau/T_1$=0.2). After 400 accumulations and subtraction of the second signal from the first, the Fourier-transformed response shown in FIG. 10 is obtained, in which the spurious signal has been removed, the remaining line being the NQR signal. The frequency range in this figure is 62.5 kHz.

Both variants of the second embodiment have the advantage of not necessarily requiring a delay before signal acquisition, so that no loss of signal occurs, although the noise is increased. However, there are certain conditions when it would be an advantage to combine two or more of the aforementioned variants, for example when the spurious response is so large that it saturates the amplifier and/or detecting stages. This might occur, for example, in the presence of large quantities of interfering materials, or piezo-electric signals from materials within or close to the r.f. probe. It is then advantageous to introduce a delay before acquisition to reduce the spurious signal to below saturation level, and then remove the remainder by means of one of the variants of the second embodiment.

It will be understood that the present invention has been described above purely by way of example, and modifications of detail can be made within the scope of the invention.

Each feature disclosed in the description, and (where appropriate) the claims and drawings may be provided independently or in any appropriate combination.

We claim:

1. A method of detecting a presence of a particular substance in a given sample, said method comprising steps of:

exciting nuclear resonance in said substance;

detecting response signals from said substance, using a probe; and adjusting said probe in dependence on a character of said sample.

2. A method according to claim 1, wherein:

said sample comprises electrically conductive material.

3. A method according to claim 2, wherein:

said sample comprises one of electronically and ionically conductive material.

4. A method according to claim 1, wherein:

said sample includes a metallic material.

5. A method according to claim 1, wherein:

said sample comprises at least one of a Nickel-plated object and a piezo-electric material.

6. A method according to claim 1, wherein:

said step of adjusting said probe comprises adjusting at least one of an electrical characteristic, an impedance, a tuning and a Q factor of said probe.

7. A method according to claim 1, wherein:

said step of adjusting said probe is performed whilst said probe is in operation.

8. A method according to claim 1, wherein:

said step of detecting response signals includes detecting interfering signals, not due to said nuclear resonance, arising from said sample; and said step of adjusting said probe comprises a step of adjusting said probe in dependence on said detected interfering signals.

9. A method according to claim 8, wherein:

said step of adjusting said probe is only performed if said interfering signals are detected.

10. A method according to claim 1, wherein:

said nuclear resonance is one of nuclear magnetic resonance and nuclear quadrupole resonance.

11. A method according to claim 1, wherein:

said nuclear resonance is nuclear quadrupole resonance, and is excited in an absence of an applied magnetic field.

12. Apparatus for detecting a presence of a particular substance in a given sample, said apparatus comprising:

exciting and detecting means for exciting nuclear resonance in said particular substance and for detecting response signals from said particular substance, said exciting and detecting means including a probe; and adjusting means for adjusting said probe in dependence on a character of said sample.

13. Apparatus according to claim 12, wherein:

said exciting and detecting means includes means for detecting interfering signals, not due to nuclear resonance, arising from said sample; and said adjusting means is arranged to adjust said probe in dependence on said interfering signals.

14. Apparatus according to claim 12, wherein:

said apparatus further comprises means for transporting said sample relative to said probe; and said adjusting means is arranged to adjust said probe substantially simultaneously with an arrival of said sample adjacent said probe.

15. A nuclear quadrupole resonance method of detecting a presence of a particular substance in a sample which gives rise to interfering signals not due to nuclear quadrupole resonance, said method comprising steps of:

applying excitation pulses to excite nuclear quadrupole resonance in said sample, said excitation pulses being applied in an absence of an applied magnetic field; and detecting signals from said sample in response to said excitation pulses, there being a delay of at least 500 $\mu$s between an end of a given one of said excitation pulses and a beginning of a detection of a signal in response to said given one of said excitation pulses.

16. A method according to claim 15, wherein:

said delay is sufficient to substantially filter out said interfering signals.

17. A method according to claim 16, wherein:

said delay is only just sufficient to substantially filter out said interfering signals.

18. A method according to claim 15, wherein:

said delay is greater than one of 600 and 1000 $\mu$s.

19. A method according to claim 15, wherein:

said delay is no greater than 1500 $\mu$s.

20. A method according to claim 15, wherein:

said delay is in one range selected from a group of from 500 to 1500 $\mu$s, from 500 to 1000 $\mu$s, from 500 to 700 $\mu$s, and from 500 to 600 $\mu$s.

21. A method according to claim 15, wherein:

each of said excitation pulses is such as to cause a free induction decay response signal, said delay being during said free induction decay response signal.

22. A method according to claim 15, wherein:

said excitation pulses are such as to cause an echo response signal, said delay being between an end of said excitation pulses and said echo response signal.

23. A method according to claim 15, wherein:

said sample includes one of a metallic material and a ferromagnetic material.

24. A method according to claim 23, wherein:

said sample includes one of a metallic material and a ferromagnetic material as a layer of plating on another material.

25. A method according to claim 24, wherein:

said layer of plating comprises Nickel.

26. A method according to claim 25, wherein:

said sample comprises at least one of a Nickel-plated object and a piezo-electric material.

27. A method of nuclear quadrupole resonance testing a sample which gives rise to interfering signals, not due to nuclear quadrupole resonance, said method comprising steps of:

exciting nuclear quadrupole resonance in said sample using at least two different types of excitation, one of said two different types of excitation including an excitation pulse having a flip angle such as to generate an inverted response signal, so that said excited nuclear quadrupole resonance can be distinguished from said interfering signals, arising from said sample, from a comparison between response signals due to said at least two different types of excitation;

detecting said response signals from said sample; and comparing said detected response signals due to said at least two different types of excitation.

28. A method according to claim 27, wherein:

said sample comprises at least one of a Nickel-plated object and a piezo-electric material.

29. A method according to claim 27, wherein:

said method tests for a presence of said sample.

30. A method according to claim 27, wherein:

said nuclear quadrupole resonance is excited in an absence of an applied magnetic field.

31. A method of nuclear resonance testing a sample which gives rise to interfering signals, not due to nuclear resonance, said method comprising steps of:

exciting nuclear resonance in said sample using at least two different types of excitation, one of said at least two different types of excitation being such as to produce, for a respective response signal from each type of excitation, a nuclear response signal and an interfering signal of a different relative amplitude, so that said excited nuclear resonance can be distinguished from said interfering signals, arising from said sample, from a comparison between response signals due to said at least two different types of excitation;

detecting said response signals from said sample; and comparing said detected response signals due to said at least two different types of excitation.

32. A method according to claim 31, wherein:

said at least two different types of excitation are such as to saturate nuclear responses to different extents.

33. A method according to claim 31, wherein:

said sample comprises at least one of a Nickel-plated object and a piezo-electric material.

34. A method according to claim 31, wherein:

said method tests for a presence of said sample.

35. A method according to claim 31, wherein:

said nuclear resonance is one of nuclear magnetic resonance and nuclear quadrupole resonance.

36. A method according to claim 31, wherein:

said nuclear resonance is nuclear quadrupole resonance, and is excited in an absence of an applied magnetic field.

37. Apparatus for nuclear resonance testing a sample which gives rise to interfering signals, not due to nuclear resonance, comprising:

means for exciting nuclear resonance in said sample using at least two different types of excitation, one of said two different types of excitation being such as to produce, for the respective response signal from each type of excitation, a nuclear response signal and an interfering signal of a different relative amplitude, so that said excited nuclear resonance can be distinguished from said interfering signals, arising from said sample, from a comparison between response signals due to said at least two different types of excitation;

means for detecting said response signals from said sample; and means for comparing said detected response signals due to said at least two different types of excitation.

38. Apparatus according to claim 37, wherein:

said at least two different types of excitation are such as to saturate nuclear responses to different extents.

39. A method of nuclear resonance testing, said method comprising steps of:

providing a sample including one of a metallic material and a ferromagnetic material as a layer of plating on another material; and exciting nuclear resonance in said sample and detecting a plurality of response signals from said sample, said plurality of response signals comprising interfering signals, not due to said nuclear resonance, arising from said sample, and genuine nuclear resonance response signals;

wherein said exciting and detecting is performed in such manner that said interfering signals are attenuated relative to said genuine nuclear resonance response signals.

40. A method according to claim 39, wherein:

said layer of plating comprises Nickel.

41. A method according to claim 39, wherein:

said sample comprises at least one of a Nickel-plated object and piezo-electric material.

42. A method according to claim 39, wherein:

said nuclear resonance is one of nuclear magnetic resonance and nuclear quadrupole resonance.

43. A method according to claim 39, wherein:

said nuclear resonance is nuclear quadrupole resonance, and is excited in an absence of an applied magnetic field.

44. A method according to claim 39, wherein:

said method tests for a presence of said sample.

* * * * *